(12) United States Patent
Davies et al.

(10) Patent No.: US 6,407,584 B1
(45) Date of Patent: Jun. 18, 2002

(54) CHARGE BOOSTER FOR CMOS DYNAMIC CIRCUITS

(75) Inventors: Andrew Douglas Davies; Daniel Lawrence Stasiak, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/479,749

(22) Filed: Jan. 7, 2000

(51) Int. Cl.[7] ............................................. H03K 19/096
(52) U.S. Cl. ............................. 326/98; 326/95; 326/93; 327/208
(58) Field of Search ............................. 326/93, 95, 98, 326/121, 112, 119

(56) References Cited

U.S. PATENT DOCUMENTS

| | | | |
|---|---|---|---|
| 4,697,109 A | * 9/1987 | Honma et al. | 307/475 |
| 5,440,243 A | 8/1995 | Lyon | |
| 5,838,170 A | * 11/1998 | Schorn | 326/98 |
| 5,852,373 A | * 12/1998 | Chu et al. | 326/98 |
| 6,094,071 A | * 7/2000 | Ciraula et al. | 326/97 |
| 6,111,434 A | * 8/2000 | Ciraula et al. | 326/98 |
| 6,150,869 A | * 11/2000 | Storino et al. | 327/534 |

* cited by examiner

Primary Examiner—Michael Tokar
Assistant Examiner—Vibol Tan
(74) Attorney, Agent, or Firm—Bracewell & Patterson LLP

(57) ABSTRACT

A charge booster for a node in a dynamic logic circuit having a logic function evaluation network that includes a switching network and a dominant input switching device adapted to receive a plurality of input signals. In one aspect of the present invention, a precharge transistor is first turned on by a clock signal during a precharge phase to precharge the node that is coupled to an output of the dynamic logic circuit. Concurrently, during the precharge phase, an evaluate transistor is turned off. Next, during an evaluate phase, the evaluate transistor is turned on by the control signal, i.e., clock signal, permitting the logic function evaluation network to perform the predefined logic function in accordance with the input signals received by the logic function evaluation network. The logic function evaluation network selectively charges or discharges the node to a voltage level based on the predefined logic function. The charge booster includes a charge booster switching device that is coupled to the node in the dynamic logic circuit. The charge booster switching device, in turn, is controlled by an input to the dominant input switching device.

21 Claims, 3 Drawing Sheets

CHARGE BOOSTER FOR CMOS DYNAMIC CIRCUITS

BACKGROUND OF THE INVENTION

1. Technical Field

The present invention relates generally to logic circuits and in particular to dynamic logic circuits. Still more particularly, the present invention relates to a charge booster for maintaining a charge level at a node of a dynamic logic circuit and a method of operation thereof.

2. Description of the Related Art

Integrated complementary metal-oxide-semiconductor (CMOS) logic circuits typically come in two types; static and dynamic field effect transistor (FET) logic gates. A static logic gate generally does not require an external clock signal to control its operation. Furthermore, the static logic gate can maintain its state for as long as a supply voltage is applied to it. A dynamic logic gate, on the other hand, generally does not hold its state indefinitely and requires an external clock signal to operate the circuit, i.e., in a pre-charge and evaluation mode. Dynamic CMOS logic gates, in contrast to static gates, generally tend to yield better performance, consume less power and typically require less silicon area for fabrication.

Charge sharing is a common problem encountered in dynamic logic circuits that may result in a complete system failure. To illustrate the problem, consider the conventional dynamic circuit that is depicted in FIG. 1. FIG. 1 illustrates a schematic diagram of a logic circuit that implements a logic function Output=A(B+C+D+E), where input A to an n-channel field effect transistor (NFET) is the dominant input. During the evaluation phase of the dynamic circuit, one or more of the inputs B, C, D and E may go logic high while, at the same time, input A remains at a logic low. This will result in charge at a node, designated precharge, to be shared with a second node, designated INT1. The charge sharing between nodes precharge and INT1 may cause a voltage. drop at the precharge node that, in turn, may cause a voltage rise at the output. This voltage rise, or noise spike, may cause errors in succeeding circuits, or if the charge sharing is significant enough, the logic circuit may even change state erroneously.

A common solution, illustrated in FIG. 2, to mitigate the charge sharing problem described above is to drive the voltage at node INT1 all the way up to a supply voltage level, thus precluding a voltage drop across the nodes precharge and INT1. FIG. 2 illustrates the conventional dynamic logic circuit depicted in FIG. 1 employing a transistor Pi coupled to the node INT1. The operation of transistor P1 is controlled by using the clock signal as a control signal to selectively turn transistor P1 ON or OFF. Transistor P1 has been included in the dynamic logic circuit to charge node INT1 to a supply voltage level during the precharge phase. In the event that one of the inputs B, C, D or E goes high while input A remains low, there will be no charge sharing since both nodes, i.e., precharge and INT1, are at substantially the same voltage level. Since no charge sharing occurs, there is no voltage drop on node precharge and consequently, no voltage rise at the output of the dynamic logic circuit.

The conventional solution discussed above to eliminate the charge sharing problem encountered in dynamic logic however, wastes power. Since transistor P1 is always turned ON at the precharge phase, node INT1 is always pulled up to the supply voltage and charged even if none of the inputs B, C, D or E is high. In the case where inputs B, C, D and E are low and input A is high, the charge placed on node INT1 by transistor P1 is removed during the evaluation phase. If this set of input conditions is present over multiple consecutive cycles, node INT1 will be constantly charged and discharged every cycle, resulting in wasted power dissipation. Furthermore, when the dynamic logic circuit is implemented using silicon-on-insulator technologies, the conventional solution illustrated in FIG. 2 results in bipolar leakage current problems. For example, under the same input conditions as discussed above, i.e., A is high and B, C, D and E are low, the charging of node INT1 causes the bodies of transistors N10 through N13 to be charged high every cycle. This maximizes the parasitic bipolar leakage currents that occur in transistors N10 through N13 when node INT1 is eventually pulled low. These bipolar leakage currents, in turn, may cause the charge at node precharge to drop, resulting in a complete circuit failure.

Accordingly, what is needed in the art is an improved dynamic logic circuit that mitigates the above-described limitations.

SUMMARY OF THE INVENTION

It is therefore an object of the present invention to provide an improved dynamic logic circuit.

It is another object of the present invention to provide a charge booster and a method of operation thereof.

To achieve the foregoing objects, and in accordance with the invention as embodied and broadly described herein, a charge booster is disclosed for a node in a dynamic logic circuit having a logic function evaluation network that includes a switching network and a dominant input switching device that are adapted to receive a plurality of input signals. In one aspect of the present invention, a precharge transistor is first turned on by a clock signal during a precharge phase to precharge the node that is coupled to an output of the dynamic logic circuit. Concurrently, during the precharge phase, an evaluate transistor, operating in a complementary fashion with the precharge transistor, is turned off. Next, during an evaluate phase, the evaluate transistor is turned on by the control signal, i.e., clock signal, permitting the logic function evaluation network to perform the predefined logic function in accordance with the input signals received by the logic function evaluation network. The logic function evaluation network selectively charges or discharges the node to a voltage level based on the pre-defined logic function. The charge booster includes a charge booster switching device that is coupled to the node in the dynamic logic circuit. The charge. booster switching device, in turn, is controlled by an input to the dominant input switching device. In a related embodiment, the dynamic logic circuit is embodied in an integrated circuit (IC) utilizing Silicon-on-Insulator (SOI) technology. another embodiment of the present invention, the transistors in the switching network and the dominant input switching device are n-channel field effect transistors (NFETS). In this case, the charge booster switching device is a p-channel field effect transistor (PFET). Alternatively, in another advantageous embodiment, the transistors in the switching network and the dominant input switching device are p-channel field effect transistors (PFETs). It should be readily apparent to those. skilled in the art that, in this case, the charge booster switching device will be a n-channel field effect transistor (NFET).

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
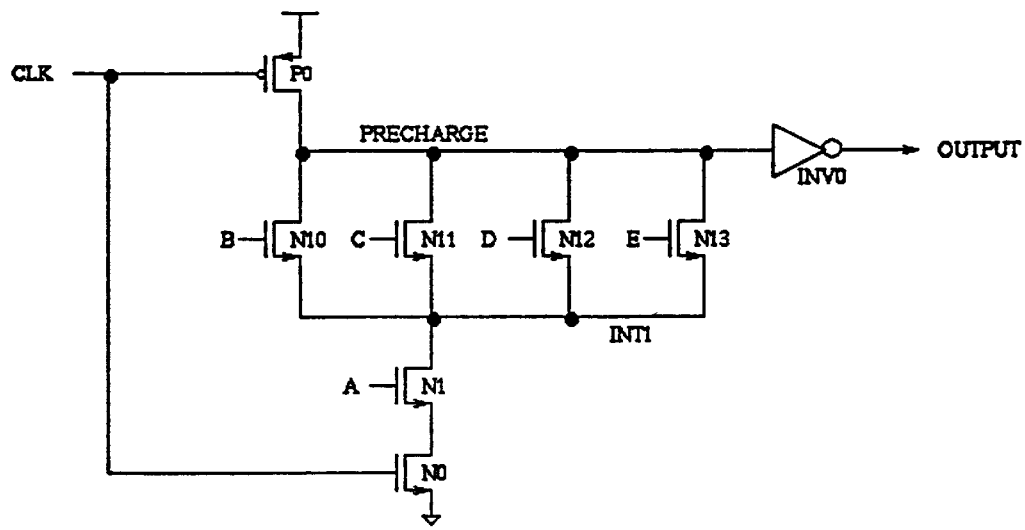
FIG. 1 illustrates a schematic diagram of a conventional dynamic logic circuit.
Figure 2:
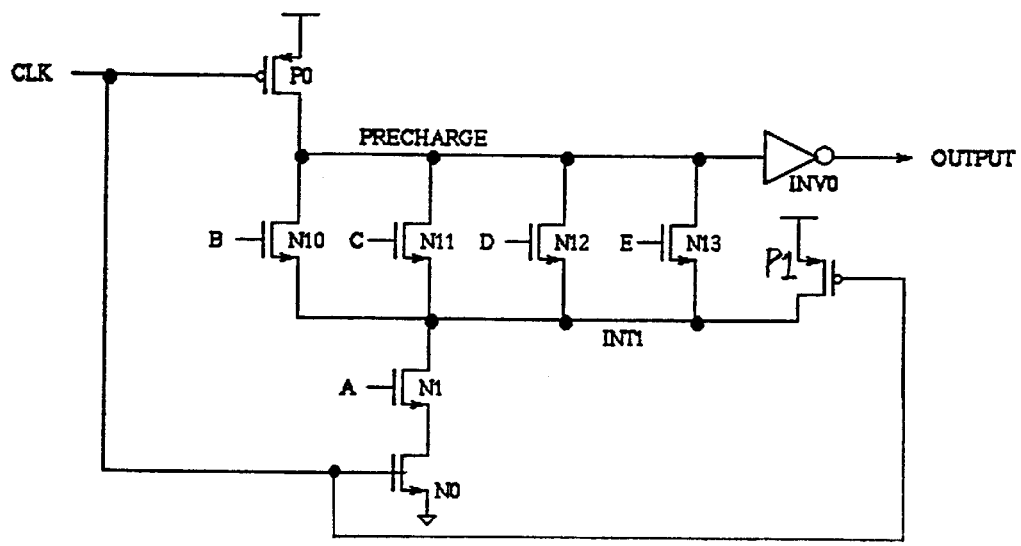
FIG. 2 illustrates the conventional dynamic logic circuit depicted in FIG. 1 employing a transistor P1 coupled to a node INT1.
Figure 3:
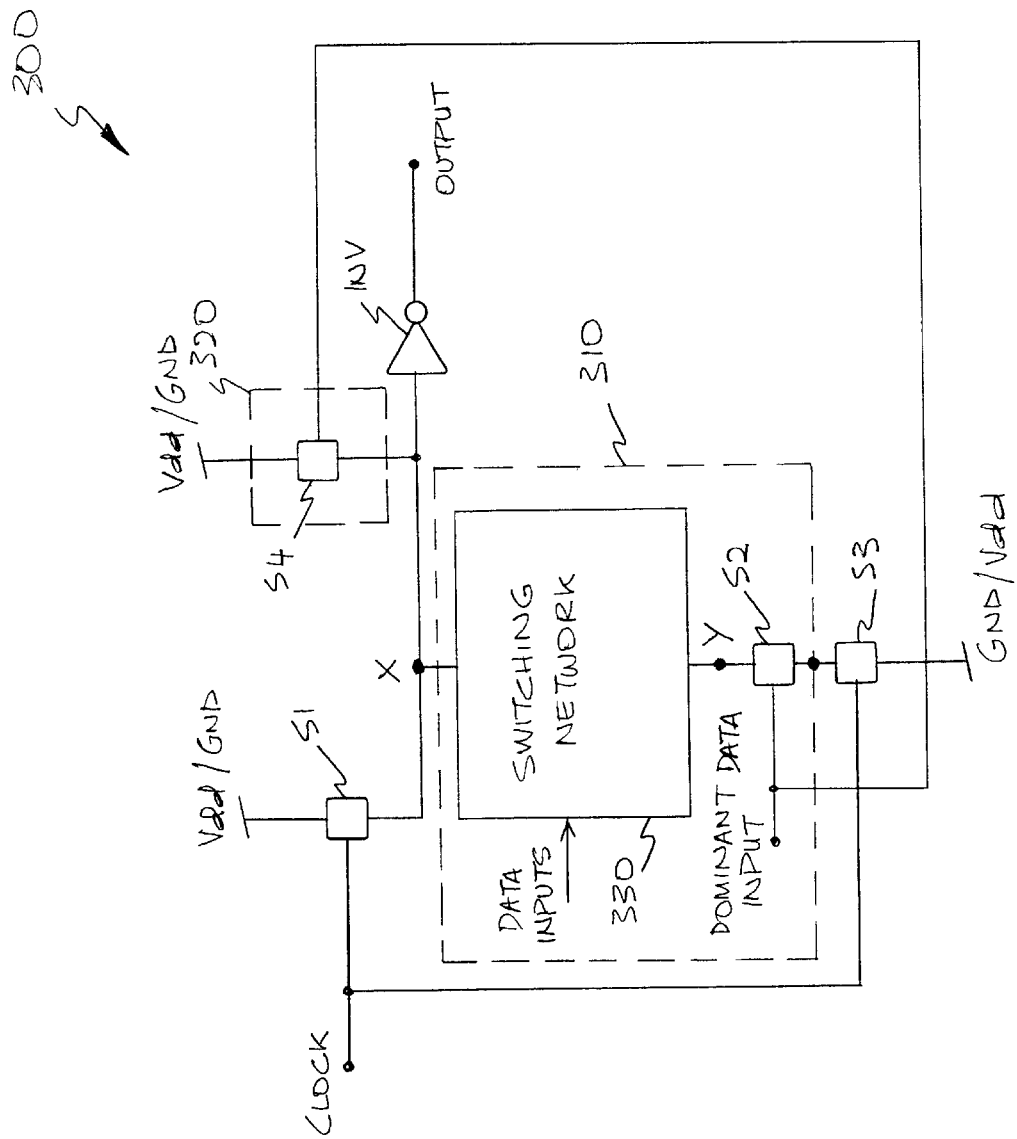
FIG. 3 illustrates a schematic diagram of an embodiment of a dynamic logic circuit utilizing a charge booster constructed according to the principles disclosed by the present invention.

With reference now to the figures, and in particular, with reference to FIG. 3, there is depicted a schematic diagram of an embodiment of a dynamic logic circuit 300 utilizing a charge booster 320 constructed according to the principles disclosed by the present invention. Dynamic logic circuit 300, in a preferred embodiment, is an integrated circuit (IC) that is implemented utilizing Silicon-on-Insulator (SOI) technologies. It should be noted that the practice of the present invention is not limited to any one particular technology. The present invention may be implemented, in other advantageous embodiments, using conventional bulk technologies.

Dynamic logic circuit 300 includes a precharging/discharging switch S1 and an evaluate switch S3 that are controlled by a clock signal CLOCK. Precharging/discharging switch S1 and evaluate switch S3, in an advantageous embodiment are field effect transistors (FETs) and depending on dynamic logic circuit 300 implementation may be either a p-channel field effect transistor (PFET) or a n-channel field effect transistor (NFET). Dynamic logic circuit 300 also includes an inverter INV, coupled to an output node OUTPUT, that functions as an output buffer for dynamic logic circuit 300.

A logic function evaluation circuit 310 is also shown having a switching network 330 and a dominant input switch S2 that are adapted to receive a plurality of inputs. A plurality of switching devices (not shown) in switching network 330 and dominant input switch S2 are typically FETs and are utilized to implement a specific logic function, in response to the plurality of inputs, for dynamic logic circuit 300. Also depicted in the illustrated embodiment are nodes X and Y, wherein node X is a precharge or a predischarging node depending on the dynamic logic circuit 300 implementation. Dynamic logic circuit 300 further includes a charge booster 320 comprising a charge booster switch S4. The operation of dynamic logic circuit 300 will hereinafter be described in greater detail with reference to FIG. 4 utilizing a specific embodiment implemented using NFETs in logic function evaluating circuit 300, i.e., NFET-logic network.

Figure 4:
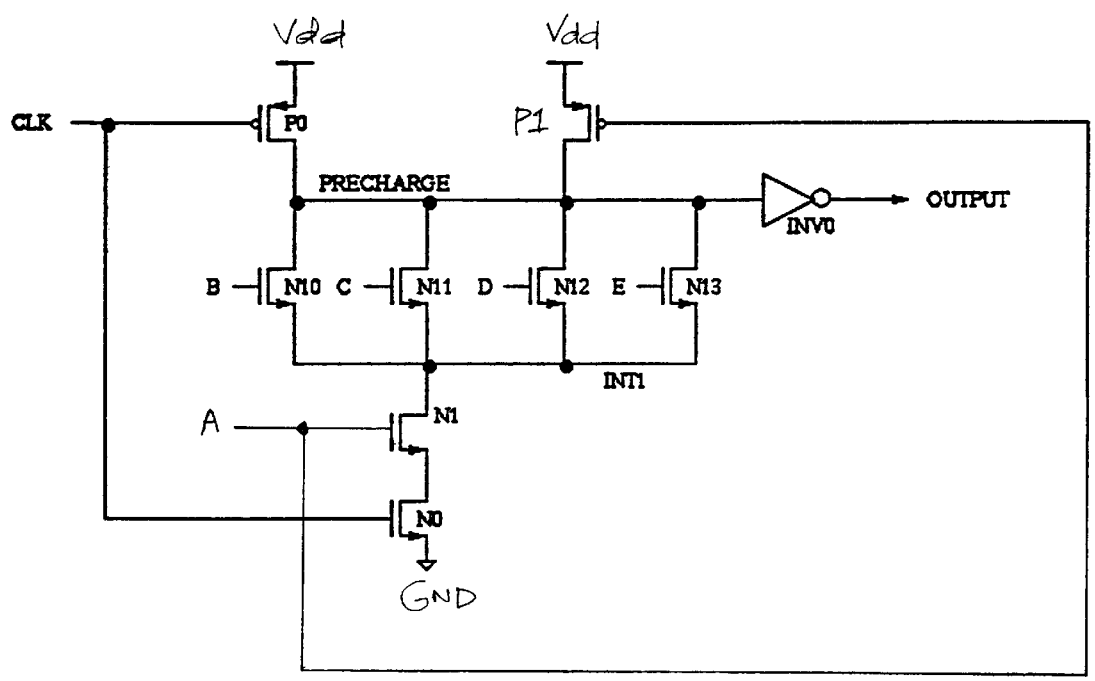
FIG. 4 illustrates a schematic diagram of an embodiment of a dynamic logic circuit utilizing a NFET-logic network and a booster circuit of the present invention

Referring now to FIG. 4, there is illustrated a schematic diagram of an embodiment of a dynamic logic circuit 400 utilizing a NFET-logic network and a booster circuit of the present invention. Dynamic logic circuit 400 includes a precharge PFET P0 and a evaluate NFET N0 that are coupled to a clock (not shown). A clock signal CLK controls the operation of precharge PFET P0 and evaluate NFET N0 in a complementary manner, wherein in a precharge phase, precharge PFET P0 is turned ON and evaluate NFET N0 is turned OFF. Conversely, in an evaluate phase, precharge PFET P0 is turned OFF and evaluate NFET N0 is turned ON. Dynamic logic circuit 400 also includes an inverter INV0 that provides a buffer for an output signal at output node OUTPUT. A first PFET P1 is utilized to implement the charge booster 320 depicted in FIG. 3 and is coupled between a supply voltage Vdd and a node, designated precharge.

Logic function evaluation circuit 310 is implemented in dynamic logic circuit 400 utilizing first, second, third, fourth and fifth NFETs N1, N10, N11, N12, N13 wherein first NFET N1 is a dominant input switching device (analogous to dominant input switch S2 in FIG. 3). An intermediate node INT (analogous to node Y in FIG. 3) is illustrated separating first NFET N1 from second, third, fourth and fifth NFETs N10, N11, N12, N13. First, second, third, fourth and fifth NFETs N1, N10, N11, N12, N13 are adapted to receive first, second, third, fourth and fifth data input signals A, B, C, D, E, respectively.

It should be readily apparent to those skilled in the art that the circuit arrangement of first, second, third, fourth and fifth NFETs N1, N10, N11, N12, N13 and their respective data input signals implements a logic function Output=A(B+C+D+E). Data input signal A is called the dominant input because when it is at a logic low, i.e., A=0, the output signal at the output node OUTPUT will also be at logic low irregardless of the signal values of second, third, fourth and fifth data input signals B, C, D, E. Furthermore, first input data signal A is coupled to the control electrode, i.e, gate, of first PFET P1 to selectively control its switching operation. It should be noted that the present invention is not limited to this specific circuit configuration. It should be readily apparent to those skilled in the art that second, third, fourth and fifth NFETs N10, N11, N12, N13, i.e., switching network 330, are an arbitrarily complex NFET network that may implement, in other advantageous embodiments, a wide variety of logic functions. It should also be noted, however, that whatever logic function is implemented that there be a dominant input data signal.

Consider the situation where charge sharing may pose a serious problem, e.g., when one (or more) of second, third, fourth and fifth data input signals B, C, D, E is at logic high while, at the same time, first data input A signal remains at a logic low. In this scenario, with the dominant input signal, i.e., first data input signal A, low, first PFET P1 is turned ON, i.e., conducting. Node precharge is pulled up to supply voltage Vdd and more current, or charge, is supplied to node precharge when charge sharing is occurring, thus reducing the voltage dip at node precharge. This effectively suppresses any noise spike at output node OUTPUT that may result from the charge sharing condition and prevents dynamic logic circuit 400 from switching erroneously. Unlike the prior art circuits discussed previously, no power is wasted for the input data condition where second, third, fourth and fifth data input signals B, C, D, E are at logic low while, at the same time, first data input A signal is at a logic high. This is because intermediate node INT is no longer precharged all the way to supply voltage Vdd at every cycle of the clock signal, therefore it is no longer possible to be constantly charging and discharging intermediate node INT every cycle.

Furthermore, the bipolar leakage currents in second, third, fourth and fifth NFETs N10, N11, N12, N13 are also reduced due to intermediate node INT not being pulled high every cycle. If the bipolar leakage currents are still appreciable, predischarging of intermediate node INT may be added to eliminate the bipolar leakage currents. It should also be noted that additional noise immunity is added for the condition when first data input signal A is at logic low throughout the evaluation phase, i.e., precharge PFET P0 OFF and evaluate NFET ON, due to first PFET P1 conducting. First PFET P1 can supply additional charge to precharge node precharge all the way through to the end of the evaluation phase when the additional charge may be required.

Although the present invention has been described in detail hereinabove in the context of a NFET-logic network, it should be reemphasized that, in other advantageous embodiments, the present invention may also be utilized with PFET-logic networks. In those cases where a PFET-logic network is utilized, it should be readily apparent to those skilled in the art that all the PFETs, i.e., precharge PFET P0 and first PFET P1, will be substituted with NFET devices and all the NFETs, i.e, first, second, third, fourth, fifth NFETs N1, N10, N11, N12, N13 and evaluate NFET N0 will be replaced with PFET devices. Furthermore, within this PFET-logic circuit configuration implementing a logic function Output=A+(BCDE), it should be noted that discharging switch Si and charge booster switch S4 implemented using NFETs will be coupled to a ground potential GND. Additionally, evaluate switch S3, which is utilizing a PFET, will be coupled to supply voltage Vdd.

The present invention may be embodied in other specific forms without departing from its spirit or essential characteristics. The described embodiments are to be considered in all respects as illustrative and not restrictive. The scope of the invention is, therefore, indicated by the appended claims rather than by the foregoing description. All changes which come within the meaning and range of equivalency of the claims are to be embraced within their scope.

What is claimed is:

1. A charge booster for a precharge node in a dynamic logic circuit having a logic function evaluation network that includes a switching network and a dominant input switching device adapted to receive a plurality of input signals, said charge booster comprising:
    a charge booster switching device coupled to said precharge node; and
    wherein said charge booster switching device is controlled by a dynamic input to said dominant input switching device, and wherein power dissipation at an intermediate node between said dominant input switching device and said switching network is minimized when said dominant input switching device is turned on and said switching network is turned off.

2. The charge booster as recited in claim 1 wherein said switching network includes at least one switching device.

3. The charge booster as recited in claim 2 wherein said network switching devices and said dominant input switching device are n-channel field effect transistors (NFETs).

4. The charge booster as recited in claim 3 wherein said charge booster switching device is a p-channel field effect transistor (PFET).

5. The charge booster as recited in claim 2 wherein said network switching devices and said dominant input switching device are p-channel field effect transistors (PFETs).

6. The charge booster as recited in claim 5 wherein said charge booster switching device is a n-channel field effect transistor (NFET).

7. The charge booster as recited in claim 1 wherein said dynamic logic circuit is embodied in an integrated circuit (IC) utilizing Silicon-on-Insulator (SOI) technology.

8. A method for maintaining a charge at a precharge node of a dynamic logic circuit having a switching network and a dominant input switching device adapted to receive a plurality of input signals, said method comprising the steps of:
    situating a charge booster switching device between said precharge node and a supply voltage; and
    controlling an operation of said charge booster switching device with a dynamic signal received at said dominant input switching device, wherein power dissipation at an intermediate node between said dominant input switching device and said switching network is minimized when said dominant input switching device is turned on and said switching network is turned off.

9. The method as recited in claim 8 wherein said switching network includes at least one switching device.

10. The method as recited in claim 9 wherein said network switching devices and said dominant input switching device are n-channel field effect transistors (NFETs).

11. The method as recited in claim 10 wherein said charge booster switching device is a p-channel field effect transistor (PFET).

12. The method as recited in claim 9 wherein said network switching devices and said dominant input switching device are p-channel field effect transistors (PFETs).

13. The method as recited in claim 12 wherein said charge booster switching device is a n-channel field effect transistor (NFET).

14. The charge booster as recited in claim 8 wherein said dynamic logic circuit is embodied in an integrated circuit (IC) utilizing Silicon-on-Insulator (SOI) technology.

15. A dynamic logic circuit, comprising:
    a pre-charge/discharging switching device;
    an evaluate switching device, wherein said pre-charge/discharging and said evaluate switching devices are coupled to a clock signal;
    a logic evaluation circuit adapted to receive a plurality of input signals, including:
    a switching network; and
    a dominant input switching device; and
    a charge booster, said charge booster comprising a charge booster switching device controlled by a dynamic input to said dominant switching device, wherein said charge booster is coupled to a precharge node of said dynamic logic circuit, and wherein power dissipation at an intermediate node between said dominant input switching device and said switching network is minimized when said dominant input switching device is turned on and said switching network is turned off.

16. The dynamic logic circuit as recited in claim 15 further comprising an inverter coupled to an output terminal.

17. The dynamic logic circuit as recited in claim 15 wherein a plurality of switching devices in said switching network and said dominant input switching device are n-channel field effect transistors (NFETs).

18. The dynamic logic circuit as recited in claim 17 wherein said charge booster switching device is a p-channel field effect transistor (PFET).

19. The dynamic logic circuit as recited in claim 15 wherein a plurality of switching devices in said switching network and said dominant input switching device are p-channel field effect transistors (PFETs).

20. The dynamic logic circuit as recited in claim 19 wherein said charge booster switching device is a n-channel field effect transistor (NFET).

21. The dynamic logic circuit as recited in claim 20 wherein said dynamic logic circuit is embodied in an integrated circuit (IC) utilizing Silicon-on-Insulator (SOI) technology.

* * * * *